(12) United States Patent
Koh et al.

(10) Patent No.: US 10,658,451 B2
(45) Date of Patent: May 19, 2020

(54) FILM ELEMENT FOR DRIVING DISPLAY DEVICE AND DISPLAY DEVICE USING THE SAME

(71) Applicant: LG Display Co., Ltd., Seoul (KR)

(72) Inventors: Geunwoo Koh, Paju-si (KR); Minsik Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/208,502

(22) Filed: Dec. 3, 2018

(65) Prior Publication Data

US 2019/0181212 A1  Jun. 13, 2019

(30) Foreign Application Priority Data

Dec. 8, 2017 (KR) .................. 10-2017-0168338

(51) Int. Cl.
  *H01L 27/32* (2006.01)
  *H01L 23/49* (2006.01)
  *H01L 23/538* (2006.01)

(52) U.S. Cl.
  CPC .......... *H01L 27/3276* (2013.01); *H01L 23/49* (2013.01); *H01L 23/5385* (2013.01); *H01L 23/5386* (2013.01); *H01L 27/3255* (2013.01)

(58) Field of Classification Search
  CPC . H01L 27/3276; H01L 23/49; H01L 23/5385; H01L 23/5386; H01L 27/3255; H01L 27/32; H01L 23/538
  USPC ....................................................... 257/773
  See application file for complete search history.

(56) References Cited

U.S. PATENT DOCUMENTS

| | | | |
|---|---|---|---|
| 6,406,113 B1* | 6/2002 | Kato | B41J 2/04553 347/14 |
| 2003/0068842 A1* | 4/2003 | Tojo | G02F 1/13452 438/119 |
| 2004/0036833 A1 | 2/2004 | Monzen | |
| 2011/0235286 A1* | 9/2011 | Kitayama | G02F 1/13452 361/749 |
| 2016/0109752 A1* | 4/2016 | Tateno | G02F 1/134336 349/5 |

FOREIGN PATENT DOCUMENTS

KR  10-2004-0018201 A  3/2004

* cited by examiner

*Primary Examiner* — Alexander O Williams
(74) *Attorney, Agent, or Firm* — Fenwick & West LLP

(57) ABSTRACT

A film element for driving a display device and a display device using the same are disclosed. The film element includes a film substrate including wirings and pads connected to the wirings, and an IC chip mounted on the film substrate to be connected to the wirings. The pads on the film substrate are grouped into a plurality of areas having different thermal correction amounts. Pads in a second area are closer to the IC chip than pads in a first area. A length of the first area is set to a length obtained by subtracting a first thermal correction amount from a first reference length. A length of the second area is set to a length obtained by subtracting a second thermal correction amount from a second reference length. The second thermal correction amount is smaller than the first thermal correction amount or has a negative value.

8 Claims, 16 Drawing Sheets

Occurrence of Shrinkage Effect by thermal correction amount β in film element

FILM ELEMENT FOR DRIVING DISPLAY DEVICE AND DISPLAY DEVICE USING THE SAME

This application claims the priority benefit of the Republic of Korea Patent Application No. 10-2017-0168338 filed on Dec. 8, 2017, which is incorporated by reference in its entirety.

BACKGROUND

Field of Technology

The present disclosure relates to a film element for driving a display device and a display device using the same.

Discussion of the Related Art

A flat panel display device includes a liquid crystal display (LCD), an electroluminescent display, a field emission display (FED), a plasma display panel (PDP), and the like. The electroluminescent display is divided into an inorganic light emitting display device and an organic light emitting display device depending on materials of a light emitting layer. An active matrix organic light emitting display device includes organic light emitting diodes (OLEDs) capable of emitting light by themselves and has many advantages such as a fast response time, a high emission efficiency, a high luminance, a wide viewing angle, and the like.

Such a display device displays an image on a screen of a display panel in which data lines intersect with gate lines (or scan lines), and pixels are arranged in a matrix form. A driving circuit of the flat panel display device may be implemented as an integrated circuit (IC) chip. A film element on which the IC chip is mounted may be bonded to the display panel through an anisotropic conductive film (ACF). The film element on which the IC chip is mounted includes a chip on film (COF) or a tape carrier package (TCP).

Outer lead bonding (OLB) pads of the film element are bonded to pads connected to signal wirings formed on a substrate of the display panel. The ACF is bonded to a bonding area of the display panel, and the OLB pads of the film element are aligned with the bonding area of the display panel, the film element is pressed on the ACF and simultaneously heat is applied to the film element, and the OLB pads of the film element are bonded to the pads of the display panel. The OLB pads of the film element are electrically connected to the pads of the display panel through conductive balls of the ACF. A length of an outer lead bonding (OLB) area of the film element is designed to be shrunk by a thermal correction amount in consideration of thermal expansion of the film element generated in bonding process of the film element. The OLB area is a bonding area in which the OLB pads to be bonded on the substrate of the display panel are arranged at a predetermined pitch. The thermal correction amount is a shrinkage applied in manufacturing the film element by an amount of thermal expansion in which the film element is expanded by heat and pressure generated in a bonding process for bonding the film element on the substrate of the display panel.

SUMMARY

A thermal correction amount is applied to a film element before a bonding process by designing an outer lead bonding (OLB) area of the film element to be shrunk by a length corresponding to the thermal correction amount in consideration of thermal expansion occurring in the bonding process of the film element and a display panel. However, the method of applying the thermal correction amount in a conventional design of the film element does not consider influence of an IC chip bonded to an inner lead bonding (ILB) area of the film element. After the IC chip of the film element is bonded by heat and pressure, the IC chip can be shrunk as the temperature of the IC chip decreases. For this reason, although the thermal correction amount is applied in the OLB area of the film element to design a length of the OLB area to be shrunk, an area by the influence of the IC chip is further shrunk. Thus, misalignment may occur between bumps of the film element and pads of the display panel.

The present disclosure provides a film element for driving a display device and a display device using the film element for optimizing the thermal correction amount in the OLB area to be bonded on a substrate of the display panel in consideration of the influence of the IC chip.

In one aspect, there is provided a film element for driving a display device including a film substrate including wirings and pads connected to the wirings and an integrated circuit (IC) chip mounted on the film substrate to be connected to the wirings of the film substrate.

The pads on the film substrate are grouped into a plurality of areas having different thermal correction amounts. Pads in a second area are closer to the IC chip than pads in a first area.

A length of the first area is set to a length obtained by subtracting a first thermal correction amount from a first reference length. A length of the second area is set to a length obtained by subtracting a second thermal correction amount from a second reference length. The second thermal correction amount is smaller than the first thermal correction amount or has a negative value.

In another aspect, there is provided a display device including a display panel to which the film element is bonded.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
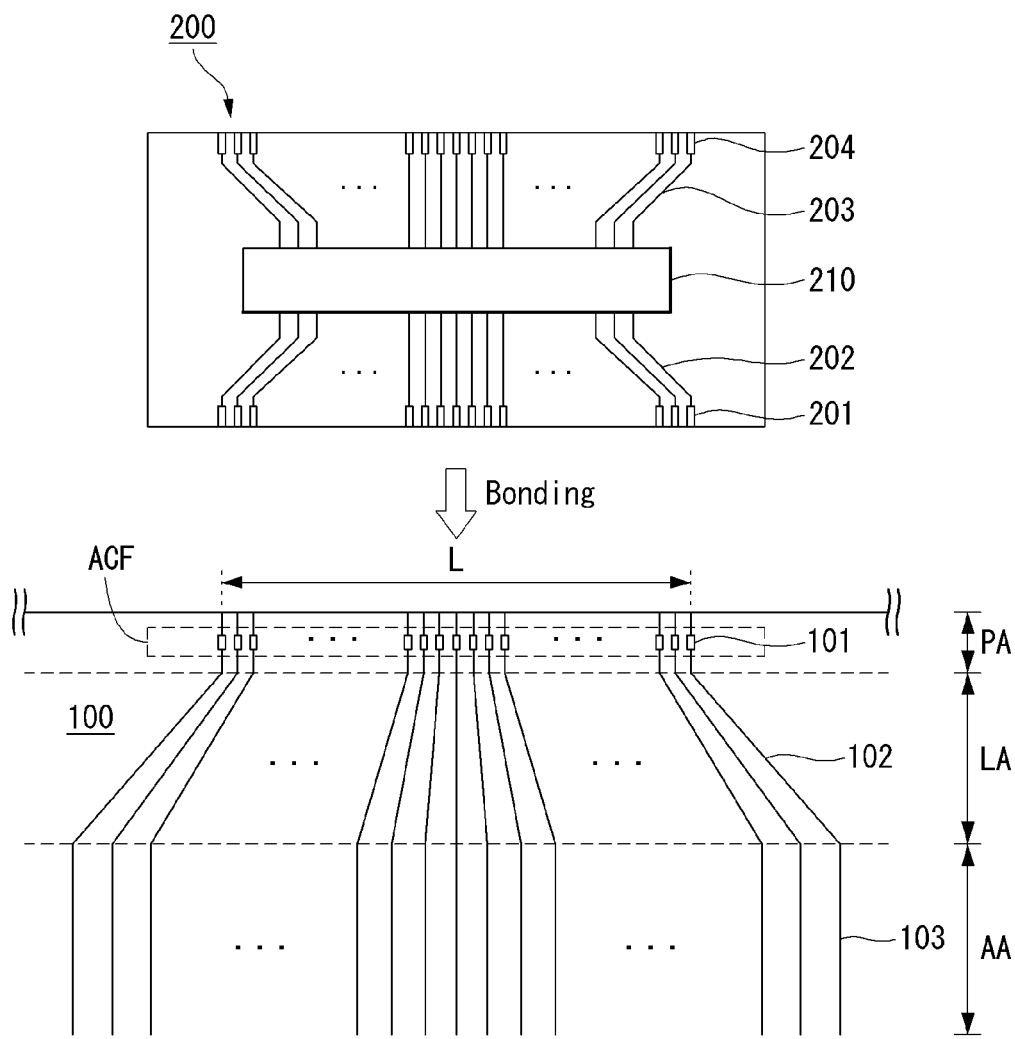
FIG. 1 is a view illustrating a film element for driving a display device and a display panel according to an embodiment of the present disclosure.

Advantages and features of the present disclosure and methods for accomplishing the same will become apparent with reference to embodiments described in detail below with reference to the accompanying drawings. However, the present disclosure is not limited to the embodiments disclosed below, and may be implemented in various forms. These embodiments are provided so that the present disclosure will be exhaustively and completely described, and will fully convey the scope of the present disclosure to those skilled in the art to which the present disclosure pertains. The present disclosure is defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout the description. In the following description, when a detailed description of well-known functions or configurations related to this document is determined to unnecessarily cloud a gist of the disclosure, the detailed description thereof will be omitted.

In the present disclosure, when the terms 'equip', 'include', 'have', 'comprised of', etc. are used, other components may be added unless only' is used. A singular expression can include a plural expression as long as it does not have an apparently different meaning in context.

In the explanation of components, even if there is no separate description, it is interpreted as including an error range.

In the description of position relationship, when a structure is described as being positioned 'on or above', 'under or below', 'next to' another structure, this description should be construed as including a case in which the structures contact each other as well as a case in which a third structure is disposed between.

In the following description of the embodiment, the terms "first", "second", etc. may be used to describe various components, but the components are not limited by such terms. These terms are only used to distinguish one component from another component. Therefore, the first component mentioned below may be the second component within the technical spirit of the disclosure.

The features of various embodiments of the present disclosure can be partially combined or entirely combined with each other, and is technically capable of various interlocking and driving. The embodiments can be independently implemented, or can be implemented in conjunction with each other.

A display device of the present disclosure includes a film element on which a driving circuit is mounted. The film element of the present disclosure includes a film substrate including wirings and outer lead bonding (OLB) pads connected to the wirings, and an integrated circuit (IC) chip mounted on the film substrate to be connected to the wirings of the film substrate. The OLB pads of the film element are grouped into a plurality of areas having different thermal correction amounts. When OLB pads in a second area are closer to the IC chip than OLB pads in a first area, a length of the first area is set to a length obtained by subtracting a first thermal correction amount from a first reference length, and a length of the second area is set to a length obtained by subtracting a second thermal correction amount from a second reference length. The second thermal correction amount is smaller than the first thermal correction amount or has a negative value. The first reference length may be set to a length of a panel pad area where the first area of the film element is bonded on the display panel. The second reference length may be set to a length of a panel pad area where the second area of the film element is bonded on the display panel. Characteristics of the film element are clearly shown in embodiments shown in FIGS. 5A to 8.

The display device of the present disclosure may be implemented as a liquid crystal display (LCD), an electroluminescent display, a field emission display (FED), a plasma display panel (PDP), or the like. The electroluminescent display is divided into an inorganic light emitting display device and an organic light emitting display device depending on materials of a light emitting layer. Pixels of the organic light emitting display device display an image using organic light emitting diodes (OLEDs) capable of emitting light by themselves.

Hereinafter, embodiments of the present disclosure will be described in detail with reference to the accompanying drawings.

FIG. 1 is a view illustrating a film element for driving a display device and a display panel according to an embodiment of the present disclosure.

Referring to FIG. 1, a film element 200 of the present disclosure includes a plurality of input wirings 203 and a plurality of output wirings 202. Outer lead bonding (OLB) pads 204 and 201 are connected to the input and output wirings 203 and 202, respectively. An integrated circuit (IC) chip 210 may be mounted on a flexible film substrate of the film element 200.

The IC chip 210 includes a driving circuit for driving pixels of a display panel 100. Input bumps of the IC chip 210 are connected to the input wirings 203 of the film element 200, and output bumps of the IC chip 210 are connected to the output wirings 202 of the film element 200.

The input wirings 203 are electrically connected to output pads of a printed circuit board (PCB) omitted from the drawing through the OLB pads 204. The output wirings 202 are bonded to pads 101 of the display panel 100 through the OLB pads 201 and an anisotropic conductive film (ACF). The OLB pads 201 are disposed in an OLB area of the film element 200.

A screen of the display panel 100 includes a pixel array AA including wirings 103 connected to the pixels. The wirings 103 each are connected to the pads 101 via link wirings 102. The link wirings 102 connect the pads 101 having a narrow pitch to the wirings 103 having a wide pitch in a 1:1 relationship. In FIG. 1, "L" is a cumulative pitch (also referred to as "total length of a panel pad area") between the pads 101 bonded to the OLB pads 201 of the film element 200.

The pads 101 are formed on a pad area PA of the display panel 100 and the link wirings 102 are formed on a link area LA.

Figure 2A:
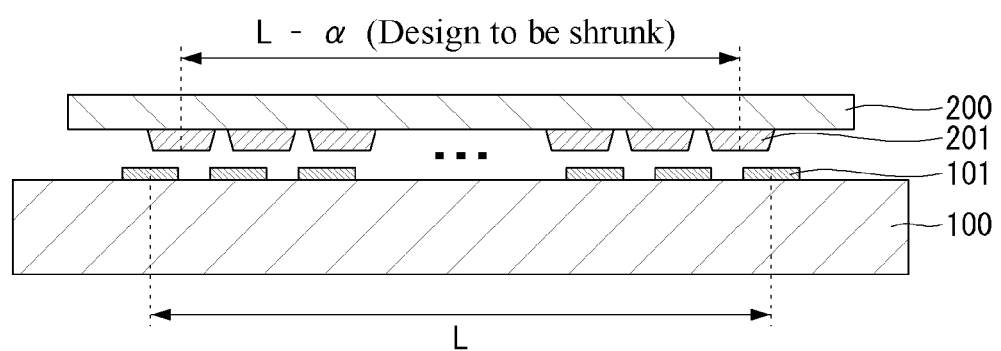
FIGS. 2A and 2B are views illustrating a bonding process of a film element and a display panel, according to embodiments of the present disclosure.
Figure 2B:
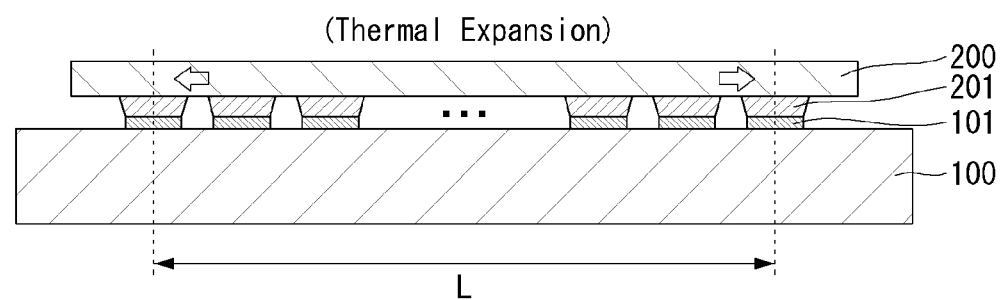

FIGS. 2A and 2B are views illustrating a bonding process of a film element 200 and a display panel 100. FIG. 2A illustrates the film element 200 aligned on a pad area of the display panel 100 before the bonding process. FIG. 2B illustrates the film element 200 which is thermally expanded in the bonding process.

Referring to FIG. 2A, a length of an outer lead bonding (OLB) area of the film element 200 is set to a length obtained by subtracting a thermal correction amount α from a total length L of a panel pad area. An OLB pads 201 are disposed within the length (L-α) of the OLB area. Therefore, the film element 200 is designed to be shrunk by the thermal correction amount α.

When an anisotropic conductive film (ACF) is bonded on a pad area PA of the display panel 100 and the film element 200 is aligned thereon, the OLB pads 201 are misaligned with pads 101 of the display panel 100 due to the thermal correction amount α. As shown in FIG. 2B, when the film element 200 is pressed onto a substrate of the display panel 100 and heat is applied to the film element 200, the film element 200 thermally expands and the OLB pads 201 of the film element 200 are aligned and bonded to the pads 101 of the display panel 100. For example, when the film element 200 is a chip on film (COF), heat of about 180 to 200° C. is applied to the COF and the COF thermally expands by a coefficient of thermal expansion (CTE) of 5 ppm/° C. of a COF film substrate. Here, the coefficient of thermal expansion (CTE) of 5 ppm/° C. is a coefficient of thermal expansion of a polyimide substrate (e.g., Upilex-V1) of a commercially available COF. A thermal expansion amount of the film element may be different depending on a substrate material of the film element. The coefficient of thermal expansion of the COF is between 2 and 16 ppm/° C. depending on the substrate material of the film element. The OLB area of the film element 200 is designed to be shrunk by the thermal correction amount in consideration of thermal expansion of the film element 200 generated in a bonding process. However, a part of the OLB area existing within an influence range of an IC chip 210 may be further shrunk.

Figure 3A:
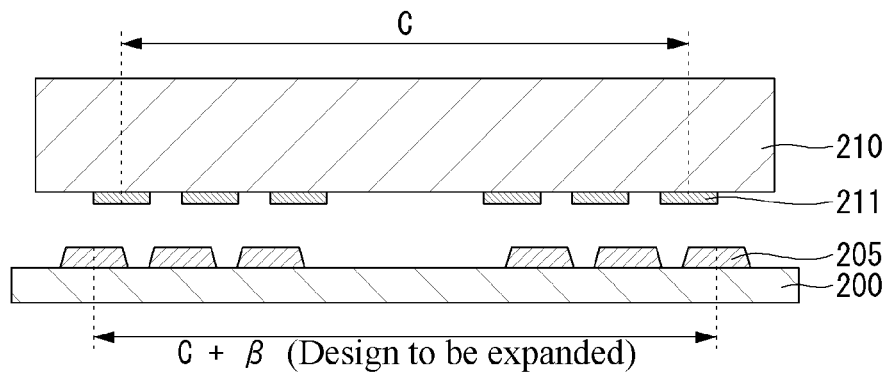
FIGS. 3A to 3C are views illustrating a bonding process of an IC chip and a film element, according to embodiments of the present disclosure.
Figure 3B:
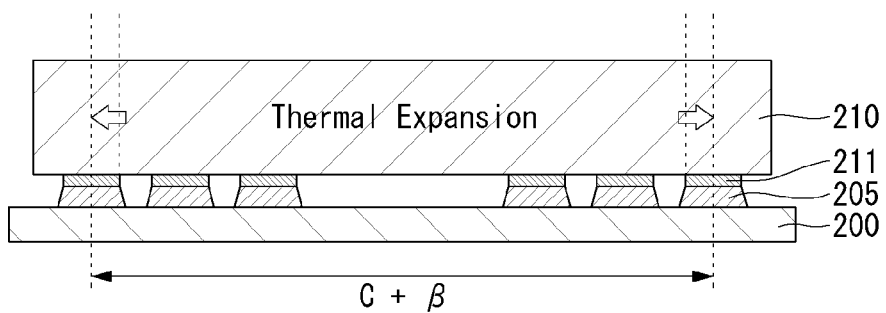
Figure 3C:
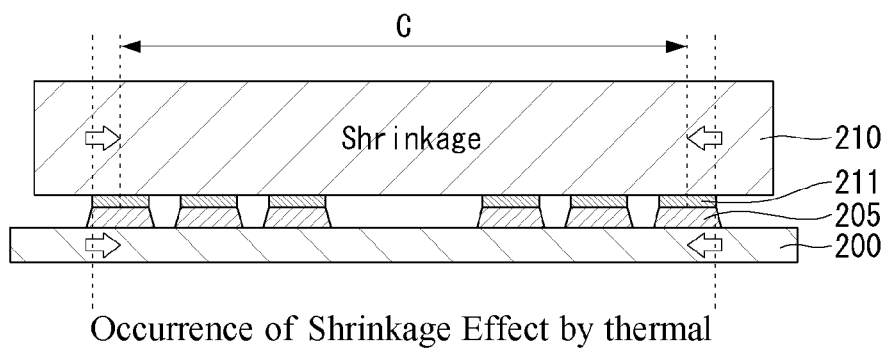

FIGS. 3A to 3C are views illustrating a bonding process of an IC chip 210 and a film element 200. FIG. 3A illustrates the IC chip 210 aligned on an inner lead bonding (ILB) area of the film element 200 before the bonding process. FIG. 3B illustrates the IC chip 210 which is thermally expanded in the bonding process. FIG. 3C is a view illustrating a shrinkage of the IC chip 210 and the film element 200 after the bonding process. In FIGS. 3A to 3C, "C" is a cumulative pitch (also referred to as "total length of IC chip bumps") between bumps 211 of the IC chip 210 to be bonded to an ILB pads 205 of the film element 200.

As shown in FIG. 3A, a length of the ILB area of the film element 200 is set to a length obtained by adding a thermal correction amount β to the total length C of the IC chip bumps. The ILB pads 205 are disposed within the length (C+β) of the ILB area. Therefore, the film element 200 is designed to be expanded by the thermal correction amount β. The ILB pads 205 of the film element 200 are connected to the wirings 202 and 203.

When the IC chip 210 is aligned on the ILB area of the film element 200, the bumps 211 of the IC chip 210 are misaligned with the ILB pads 205 of the film element 200 due to the thermal correction amount β. As shown in FIG. 3B, when the IC chip 210 is pressed onto a substrate of the film element 200 and heat is applied to the IC chip 210, the IC chip 210 thermally expands and the bumps 211 of the IC chip 210 are aligned and bonded to the ILB pads 205 of the film element 200. The bumps 211 of the IC chip 210 are bonded to the ILB pads 205 of the film element 200 by a compressive force by heat and pressure. A tin layer can be plated on the ILB pad 205 of the film element 200 is melted (tin melting point: 231.9° C.) and bonded to the bumps 211 of the IC chip 210. For example, when the film element 200 is a chip on film (COF), in this bonding process, heat of about 400 to 450° C. is applied to the IC chip 210, and the IC chip 210 thermally expands by a coefficient of thermal expansion (CTE) of 3 ppm/° C.

After the bonding process, the temperature and pressure applied to the IC chip 210 are released. As a result, since the IC chip 210 is shrunk in a state of bonding the IC chip 210 to the film element 200, the substrate of the film element 200 is shrunk in conjunction with the shrinkage of the IC chip 210. At this time, the length of the ILB area of the film element 200 can be restored to C originally.

Figure 4A:
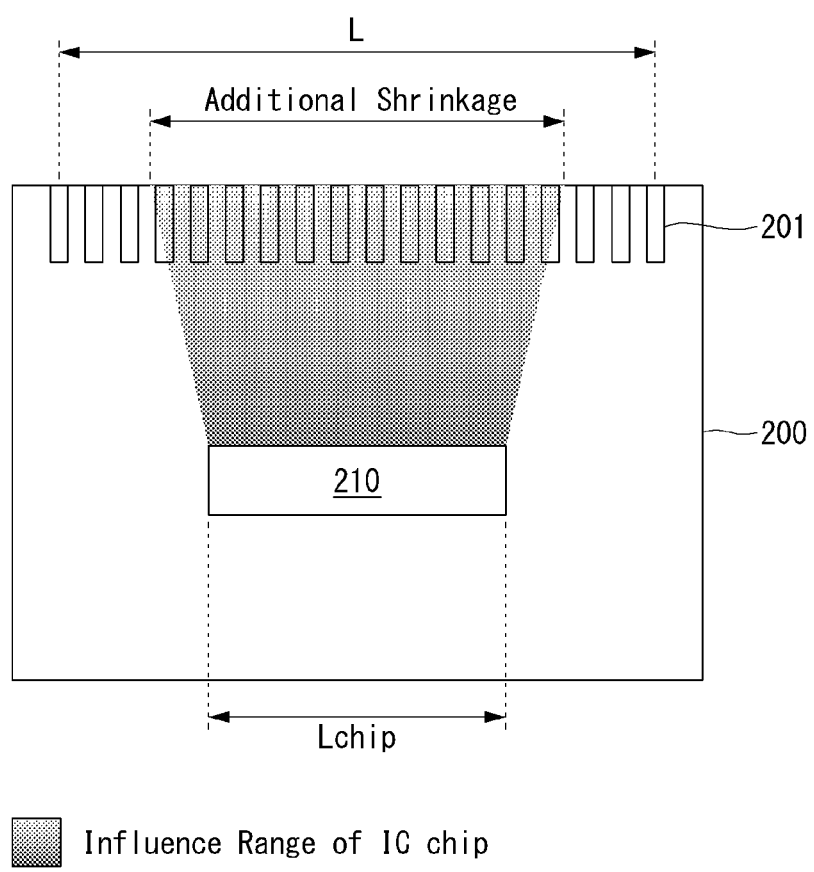
FIGS. 4A to 4C are views illustrating an example of an additional shrinkage of a film element within an influence range of an IC chip, according to embodiments of the present disclosure.
Figure 4B:
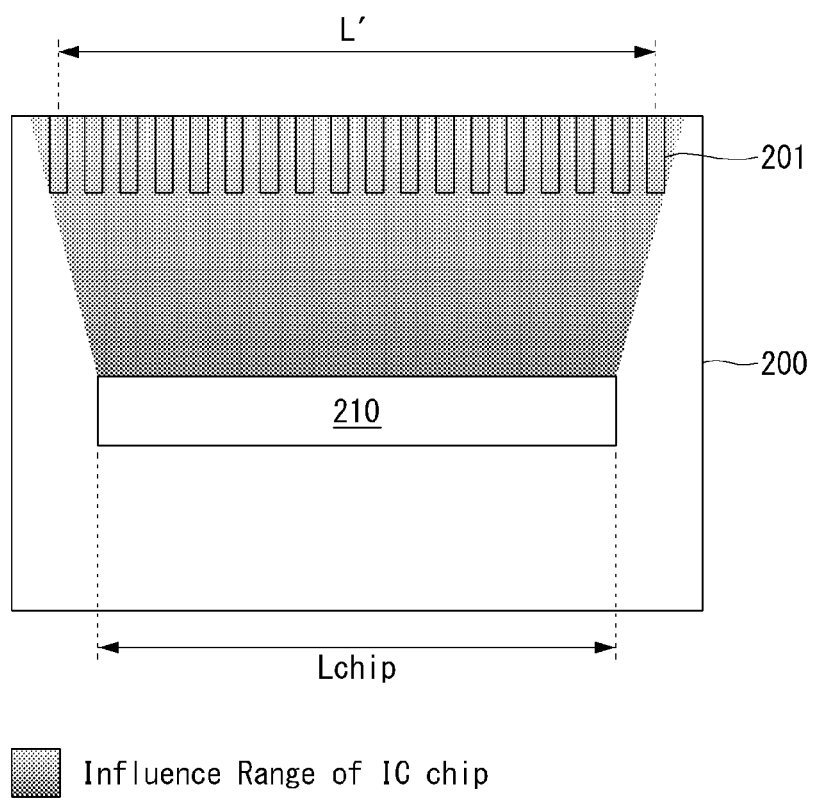
Figure 4C:
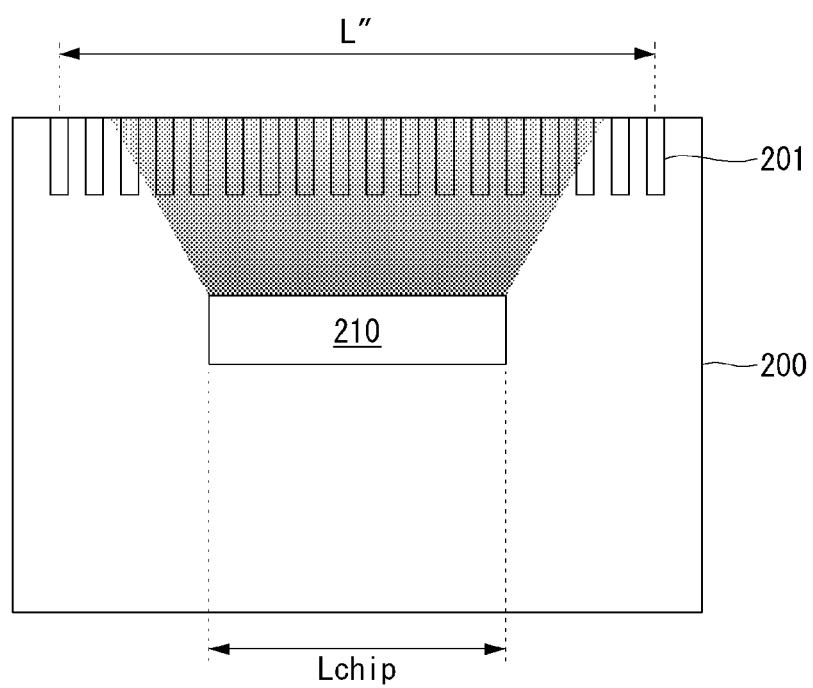

FIGS. 4A to 4C are views illustrating an example of an additional shrinkage of a film element 200 within an influence range of an IC chip 210.

As shown in FIG. 4A, when an influence range of an IC chip 210 is small in an OLB area of a film element 200, a length of the OLB area of the film element 200 can satisfy a design value L by a thermal correction amount α in a bonding process. However, as shown in FIGS. 4B and 4C, when a shrinkage area range of the IC chip 210 is large in the OLB area of the film element 200, a length of the OLB area of the film element 200 may be shortened to L' and L". FIG. 4B shows an example in which a length Lchip of the IC chip 210 becomes longer, and the shrinkage area range of the IC chip 210 becomes larger in the OLB area of the film element 200. FIG. 4C shows an example in which a position of the IC chip 210 on the film element 200 is disposed to be close to the OLB area, and the shrinkage area range of the IC chip 210 becomes larger in the OLB area of the film element 200.

Further, the IC chip 210 mounted on the film element 200 constrains the thermal expansion of the film element 200. Accordingly, when the IC chip 210 becomes larger or the IC chip 210 is disposed to be close to the OLB area, since a portion that is not thermally expanded by a predetermined thermal correction amount in the OLB area increases due to a constraint force of the IC chip 210, bonding failure such as misalignment may occur in the bonding process of bonding the film element 200 on the display panel 100.

The present disclosure differentiates the thermal correction amounts in advance applied to the OLB area of the film element 200 considering the influence range of the IC chip 210. When the film element 200 is bonded onto the substrate of the display panel 100, an OLB pads 201 existing within the influence range of the IC chip 210 are shrunk due to the IC chip 210 or constrained by the IC chip 210, so that the thermal expansion is limited.

Figure 5A:
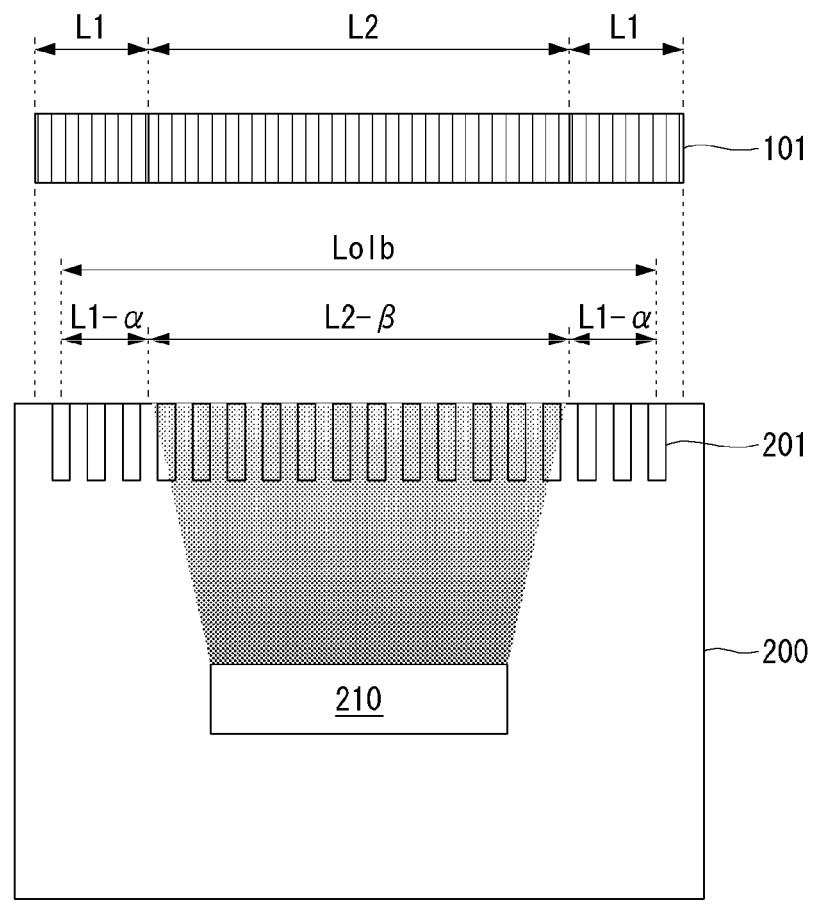
FIGS. 5A and 5B are views showing thermal compensation amounts of a film element according to a first embodiment of the present disclosure.
Figure 5B:
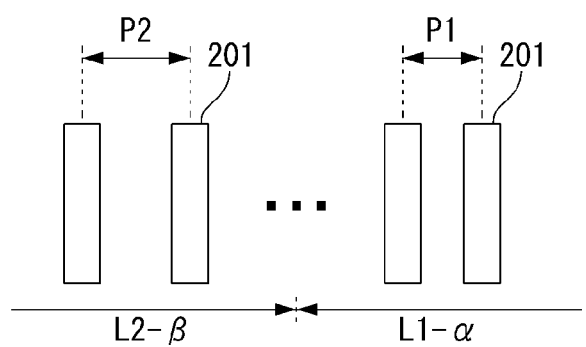

FIGS. 5A and 5B show examples in which OLB areas are partitioned and thermal correction amounts are set differently for each area in consideration of an influence of an IC chip 210 in a film element 200 in which OLB pads 201 are arranged in one row.

FIGS. 5A and 5B are views showing thermal compensation amounts of a film element according to a first embodiment of the present disclosure.

Referring to FIGS. 5A and 5B, the present disclosure divides an OLB area Lolb of the film element 200 into an influence range and a non-influence range of the IC chip 210, and divides the OLB area Lolb into a plurality of areas to apply a thermal correction amount differently for each of the areas.

The OLB area may be grouped into a first area corresponding to a non-affected area outside a shrinkage area range of the IC chip 210 and a second area included within the shrinkage area range of the IC chip 210.

Each of the first area and the second area includes a plurality of OLB pads 201. The OLB pads in the first and second areas may be arranged in one row. The OLB pads in the first area may be separated with the second area interposed between. In other words, the second area may divide the first area into plurality of sub-areas. A length of the first area is L1-$\alpha$, and a length of the second area is L2-$\beta$. $\alpha$ and $\beta$ are thermal correction amounts and a is greater than $\beta$. The second area is a portion where the thermal expansion of the film element 200 is restricted in a bonding process due to constraint of the IC chip 210. Therefore, the thermal correction amount $\beta$ of the second area should be set smaller than that a of the first area.

L1 is a length of a first area of a panel pad area to which the first area of the film element 200 is bonded on a display panel 100. L2 is a length of a second area of the panel pad area to which the second area of the film element 200 is bonded on the display panel 100. The panel pad area includes pads 101 corresponding to the OLB pads disposed in the OLB area of the film element in a 1:1 relationship.

A pitch between the OLB pads 201 is determined in inverse proportion to the thermal correction amounts $\alpha$ and $\beta$ applied to the OLB area of the film element 200. For example, as shown in FIG. 5B, an average pitch P2 between the OLB pads in the second area may be set to be larger than an average pitch P1 between the OLB pads in the first area. The thermal correction amount $\beta$ of the second area belonging to the influence range of the IC chip 210 may be set to a negative value. In this case, the length of the second area may be larger than the length L2 of the second area of the panel pad area.

Figure 6A:
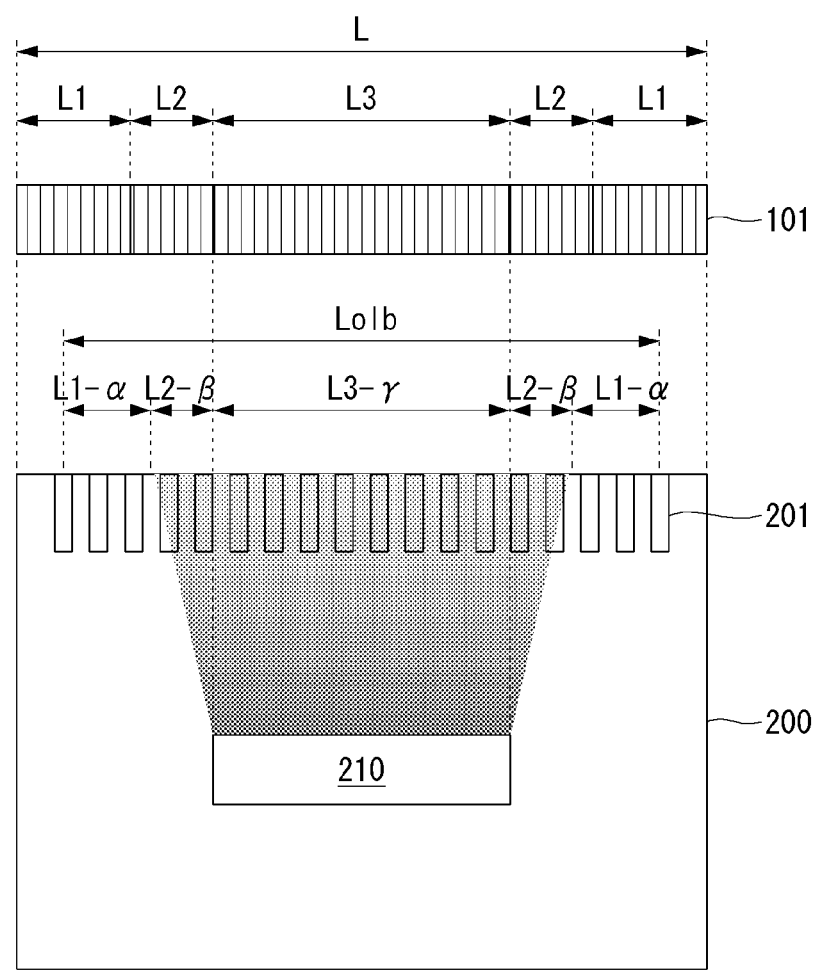
FIGS. 6A and 6B are views showing thermal compensation amounts of a film element according to a second embodiment of the present disclosure.
Figure 6B:
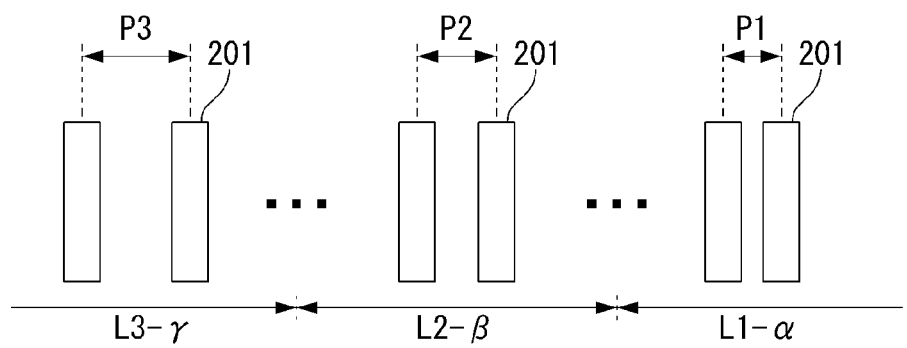

FIGS. 6A and 6B are views showing thermal compensation amounts of a film element according to a second embodiment of the present disclosure.

Referring to FIGS. 6A and 6B, the present disclosure divides an OLB area Lolb of a film element 200 into an influence range and a non-influence range of an IC chip 210, and divides the OLB area Lolb into a plurality of areas. In the present disclosure, the influence range of the IC chip may be divided into two or more, and the thermal correction amount may be differentially applied to each area considering a degree of influence of the IC chip 210.

The OLB area Lolb may be grouped into a first area corresponding to a non-affected area outside a shrinkage area range of the IC chip 210 and a second area and a third area included within the shrinkage area range of the IC chip 210. Since the third area is closer to the IC chip 210 than the second area, and is more influenced by the IC chip 210 in a bonding process of the film element 200 and a display panel 100, the third area has a smaller thermal expansion than the second area.

Each of the first to third areas includes a plurality of OLB pads 201. The OLB pads in the first to third areas may be arranged in one row. The OLB pads in the first area may be separated with the second and third areas interposed between. In other words, the second and the third area may divide the first area into plurality of sub-areas. The OLB pads in the second area may be disposed between the first area and the third area. A length of the first area is L1-$\alpha$, and a length of the second area is L2-$\beta$. A length of the third area is L3-$\gamma$.

$\alpha$, $\beta$, and $\gamma$ are thermal correction amounts. Since the third area has a larger constraint force of the IC chip 210 than the second area, it may be preferable that the thermal correction amount for each area is set to $\alpha > \beta > \gamma$ considering a difference in an amount of thermal expansion occurring in the bonding process.

L1 is a length of a first area of a panel pad area to which the first area of the film element 200 is bonded on the display panel 100. L2 is a length of a second area of the panel pad area to which the second area of the film element 200 is bonded on the display panel 100. L3 is a length of a third area of the panel pad area to which the third area of the film element 200 is bonded on the display panel 100. The panel pad area includes pads 101 corresponding to the OLB pads 201 disposed in the OLB area of the film element 200 in a 1:1 relationship.

A pitch between the OLB pads 201 is determined in inverse proportion to the thermal correction amounts $\alpha$, $\beta$, and $\gamma$ applied to the OLB area of the film element 200. For example, as shown in FIG. 6B, an average pitch P3 between the OLB pads in the third area may be set to be larger than an average pitch P2 between the OLB pads in the second area. The average pitch P2 between the OLB pads in the second area may be set to be larger than an average pitch P1 between the OLB pads in the first area. One or more of the thermal correction amount $\beta$, $\gamma$ of the second and third areas belonging to the influence range of the IC chip 210 may be set to negative values. In this case, the length of at least one of the second and third areas may be larger than the length L2, L3 of the corresponding areas of the panel pad area.

Figure 7:
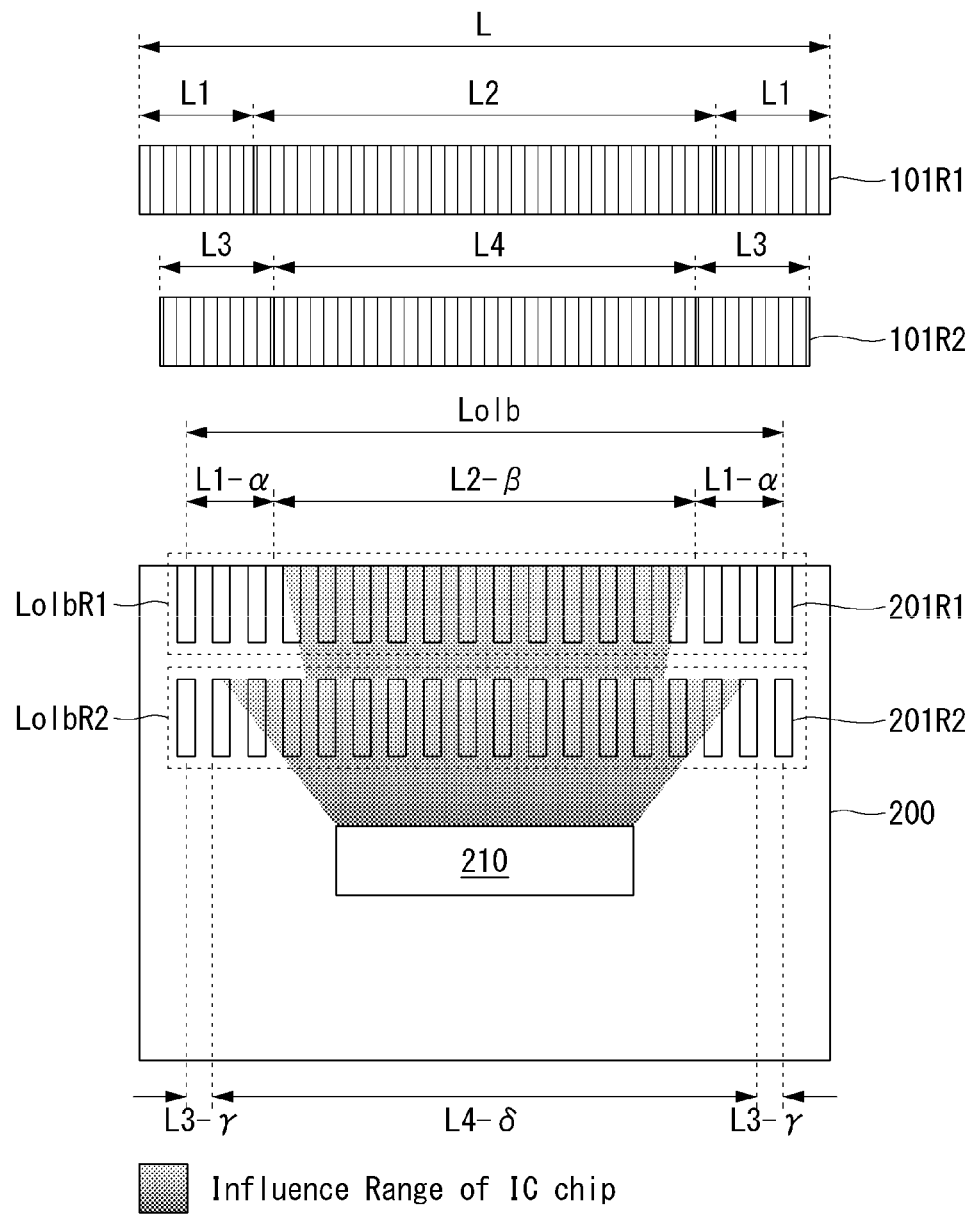
FIG. 7 is a view showing thermal correction amounts of a film element according to a third embodiment of the present disclosure.
Figure 8:
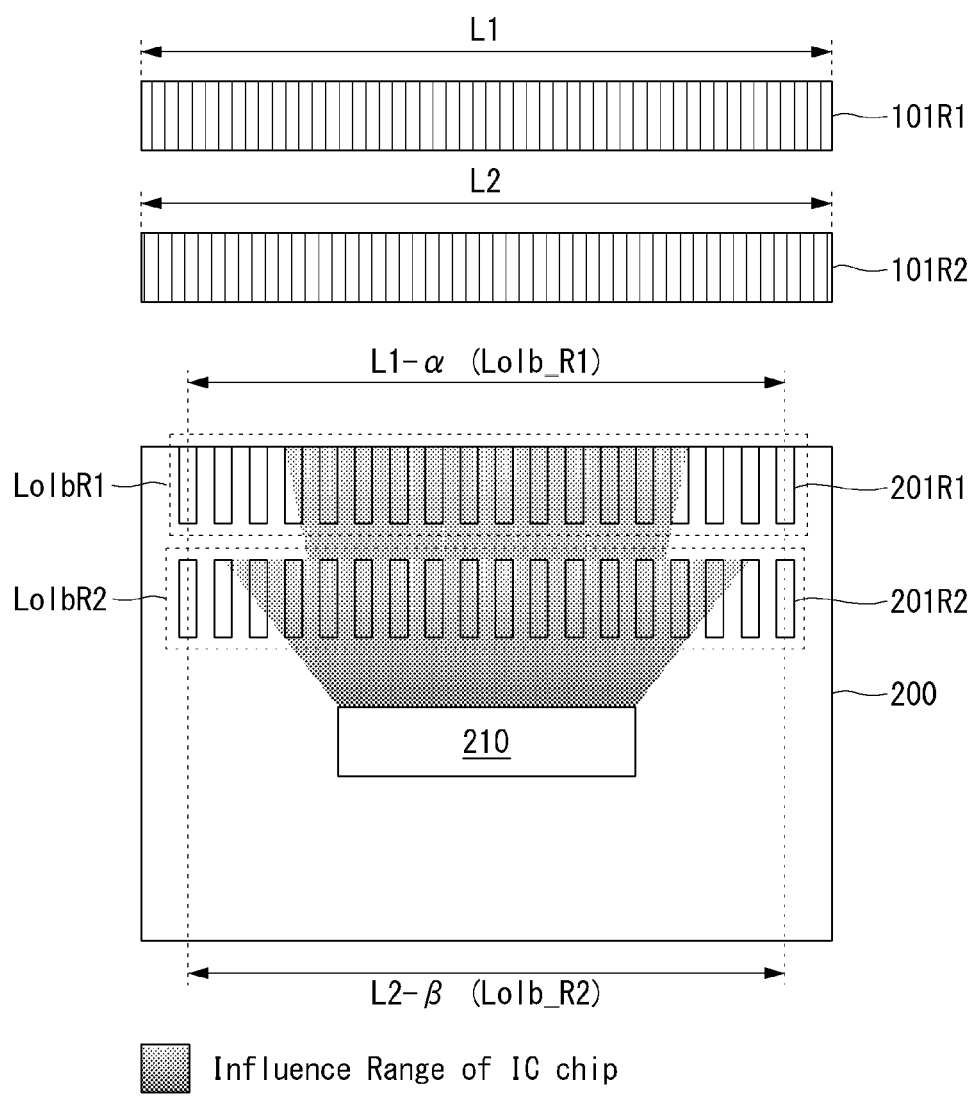
FIG. 8 is a view showing thermal correction amounts of a film element according to a fourth embodiment of the present disclosure.

FIGS. 7 and 8 show examples in which OLB areas of two rows are partitioned and thermal correction amounts are set differently for each area in consideration of an influence of an IC chip 210 in a film element 200 in which OLB pads 201R1 and 201R2 are arranged in two rows. Since the film elements shown in FIGS. 7 and 8 include two rows of the OLB areas, a degree of integration of the OLB pads is doubled.

FIG. 7 is a view showing thermal correction amounts of a film element according to a third embodiment of the present disclosure.

Referring to FIG. 7, the present disclosure divides each of first and second OLB areas LolbR1 and LolbR2 of the film element 200 into an influence range and a non-influence range of the IC chip 210, and divides it into a plurality of areas to apply a thermal correction amount differently for each of the areas.

The film element 200 includes a first OLB area LolbR1 in which OLB pads 201R1 are arranged in one row, and a second OLB area LolbR2 which is separated from the first OLB area LolbR1 and in which OLB pads 201R2 are arranged in one row. Each of the first and second OLB areas LolbR1 and LolbR2 includes a plurality of OLB pads 201R1 and 201R2. Since the second OLB area LolbR2 is closer to the IC chip 210 than the first OLB area LolbR1, the second OLB area LolbR2 receives a greater constraint force of the IC chip 210.

The first OLB area LolbR1 may be grouped into a first area corresponding to a non-affected area outside a shrinkage area range of the IC chip 210 and a second area included within the shrinkage area range of the IC chip 210. The OLB pads 201R1 of the first and second areas may be arranged in one row. A length of the first area is L1-$\alpha$, and a length of the second area is L2-$\beta$. $\alpha$ and $\beta$ are thermal correction amounts. Since the second area has a greater constraint force of the IC chip 210 than the first area, it may be preferable that the thermal correction amount for each area is set to $\alpha$>$\beta$ in consideration of a difference in an amount of thermal expansion generated in a bonding process.

L1 is a length of a first area of a first panel pad area to which the first area of the first OLB area LolbR1 is bonded on a display panel 100. L2 is a length of a second area of the first panel pad area to which the second area of the first OLB area LolbR1 is bonded on the display panel 100. The first panel pad area includes pads 101R1 corresponding to the OLB pads 201R1 of the first OLB area LolbR1 in a 1:1 relationship.

A pitch between the OLB pads 201R1 is determined in inverse proportion to the thermal correction amounts $\alpha$ and $\beta$ applied to the first OLB area LolbR1. For example, an average pitch between the OLB pads 201R1 in the second area may be set to be larger than an average pitch between the OLB pads 201R1 in the first area. The thermal correction amount $\beta$ of the second area belonging to the influence range of the IC chip 210 may be set to a negative value. In this case, the length of the second area may be larger than the length L2 of the second area of the first panel pad area.

The second OLB area LolbR2 may be grouped into a first area corresponding to a non-affected area outside a shrinkage area range of the IC chip 210 and a second area included within the shrinkage area range of the IC chip 210. The OLB pads 201R2 in the first and second areas may be arranged in one row at a position closer to the IC chip 210 than the OLB pads 201R1 in the first OLB area LolbR1. A length of the first area is L3-$\gamma$, and a length of the second area is L4-$\delta$. $\gamma$ and $\delta$ are thermal correction amounts. Since the second area has a greater constraint force of the IC chip 210 than the first area, it may be preferable that the thermal correction amount for each area is set to $\gamma$>$\delta$ in consideration of a difference in an amount of thermal expansion generated in a bonding process. The second OLB area LolbR2 receives a greater constraint force of the IC chip 210 than the first OLB area LolbR1. In consideration of this, the thermal correction amounts of the first and second OLB areas LolbR1 and LolbR2 may be set to $\alpha$>$\gamma$ and $\beta$>$\delta$.

L3 is a length of a first area of a second panel pad area to which the first area of the second OLB area LolbR2 is bonded on the display panel 100. L4 is a length of a second area of the second panel pad area to which the second area of the second OLB area LolbR2 is bonded on the display panel 100. The second panel pad area includes pads 101R2 corresponding to the OLB pads 201R2 of the second OLB area LolbR2 in a 1:1 relationship.

A pitch between the OLB pads 201R2 is determined in inverse proportion to the thermal correction amounts $\gamma$ and $\delta$ applied to the second OLB area LolbR2. For example, an average pitch between the OLB pads 201R2 in the second area may be set to be larger than an average pitch between the OLB pads 201R2 in the first area. The thermal correction amount $\delta$ of the second area belonging to the influence range of the IC chip 210 may be set to a negative value. In this case, the length of the second area may be larger than the length L4 of the second area of the second panel pad area.

FIG. 8 is a view showing thermal correction amounts of a film element according to a fourth embodiment of the present disclosure.

Referring to FIG. 8, the present disclosure may set thermal correction amounts $\alpha$ and $\beta$ of first and second OLB areas LolbR1 and LolbR2 of a film element 200 to different values based on difference in a constraint force of an IC chip 210.

The first OLB area LolbR1 and the second OLB area LolbR2 include a plurality of OLB pads 201R1 and 201R2, respectively. Since the second OLB area LolbR2 is closer to the IC chip 210 than the first OLB area LolbR1, the second OLB area LolbR2 receives a greater constraint force of the IC chip 210. In view of this, the present disclosure may set the thermal correction amount $\beta$ of the second OLB area LolbR2 to be smaller than that $\alpha$ of the first OLB area LolbR1 or set to a negative value.

L1 is a length of a first panel pad area to which the first OLB area LolbR1 is bonded on a display panel 100. L2 is a length of a second panel pad area to which the second OLB area LolbR2 is bonded on the display panel 100. The first and second panel pad area includes pads 101R1, 101R2 corresponding to the OLB pads 201R1, 201R2 in a 1:1 relationship.

Figure 9:
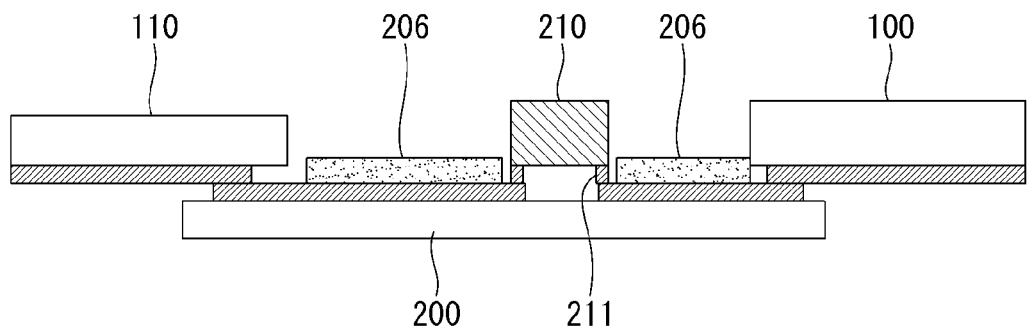
FIG. 9 is a sectional view showing an example in which a film element shown in FIGS. 5A to 6B is bonded to a display panel, according to embodiments of the present disclosure.

FIG. 9 is a sectional view showing an example in which a film element 200 shown in FIGS. 5A to 6B is bonded to a display panel 100.

Referring to FIG. 9, in a film element 200, wiring patterns including wirings, OLB pads, and the like are formed on an upper surface of a film substrate. The film substrate may be a polyimide substrate. A solder resist 206 covers the wiring patterns of the film element 200. Input wirings of the film element 200 are bonded to a PCB 110 through the OLB pads. Output wirings of the film element 200 are bonded to pads of the display panel 100 through the OLB pads.

Figure 10:
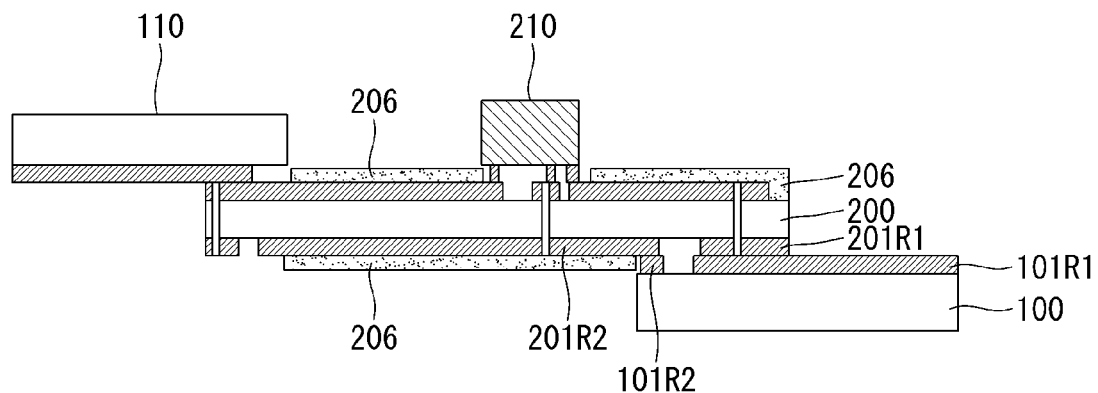
FIG. 10 is a sectional view showing an example in which a film element shown in FIGS. 7 and 8 is bonded to a display panel, according to an embodiment of the present disclosure.

FIG. 10 is a sectional view showing an example in which a film element 200 shown in FIGS. 7 and 8 is bonded to a display panel 100.

Referring to FIG. 10, in a film element 200, wiring patterns including wirings, OLB pads, and the like are formed on upper and lower surfaces of a film substrate. The film element 200 may double a degree of integration of the wirings and the OLB pads as compared with the film element shown in FIG. 9. The wiring patterns formed on the upper surface are connected to the wiring patterns formed on the lower surface, for example, through a metal filled in a hole. A solder resist 206 covers the wiring patterns on the upper and lower surfaces of the film element 200. Input wirings of the film element 200 are bonded to a PCB 110 through the OLB pads. Output wirings of the film element 200 are bonded to the pads 101R1, 101R2 of the display panel 100 through the OLB pads 201R1, 201R2.

Figure 11:
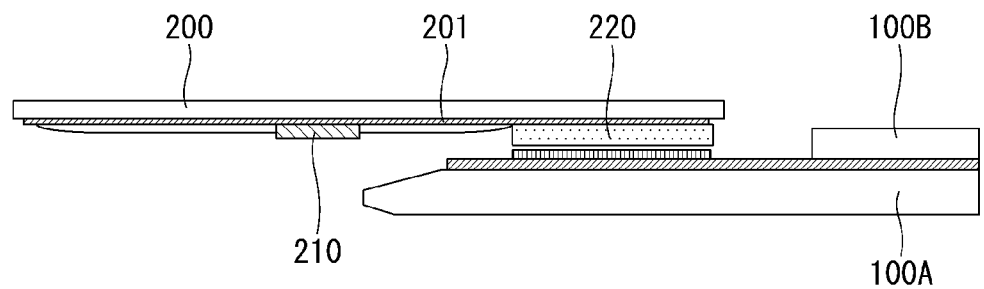
FIG. 11 is a view showing an example in which a film element is bonded to a display panel in a forward bonding process, according to an embodiment of the present disclosure.

FIG. 11 is a view showing an example in which a film element 200 is bonded to a display panel 100 in a forward bonding process.

Referring to FIG. 11, in the forward bonding process, an OLB area of a film element 200 is bonded to a display panel 100 through an ACF 220 in a state in which the film element 200 is aligned with the display panel 100 so that an input OLB pad of the film element 200 protrudes out of the display panel 100. The display panel 100 may be divided into an upper substrate 100B and a lower substrate 100A, and a pixel array may be formed on any one of the upper substrate 100B and the lower substrate 100A. The upper substrate 100B may be formed with a color filter array. In a case of an organic light emitting display device, the upper substrate 100B may be used as an encapsulation for protecting the pixel array from moisture and oxygen.

Figure 12:
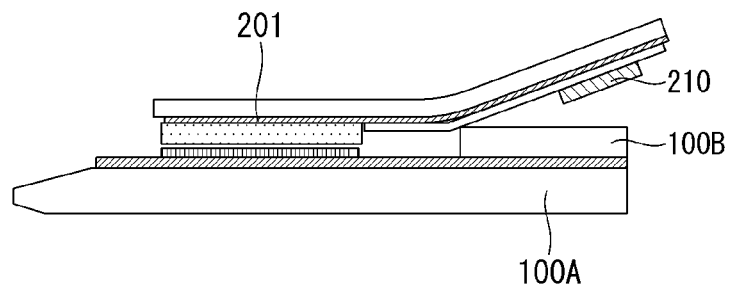
FIG. 12 is a view showing an example in which a film element is bonded to a display panel in a backward bonding process, according to an embodiment of the present disclosure.

FIG. 12 is a view showing an example in which a film element is bonded to a display panel in a backward bonding process.

Referring to FIG. 12, in the backward bonding process, an OLB area of a film element 200 is bonded to a display panel 100 through an ACF 220 in a state in which the film element 200 is aligned with the display panel 100 so that an input OLB pad of the film element 200 faces inside the display panel 100. The film element 200 bonded to the display panel 100 does not protrude out of the display panel 100 by the backward bonding process.

Figure 13:
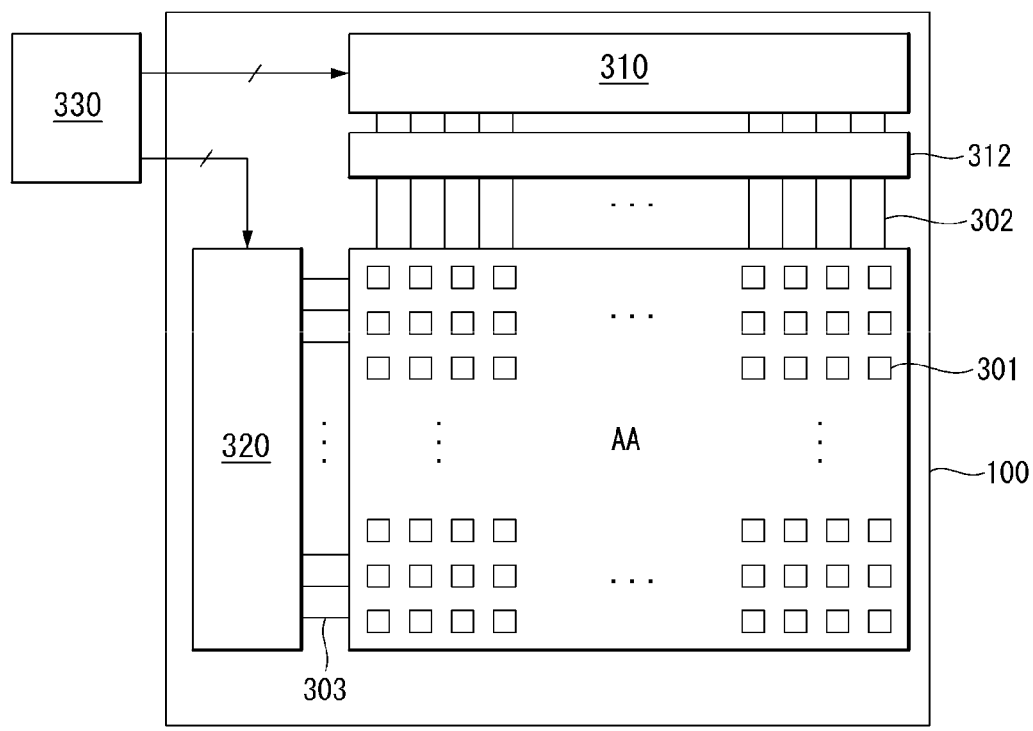
FIG. 13 is a block diagram showing a display device according to an embodiment of the present disclosure.
Figure 13:
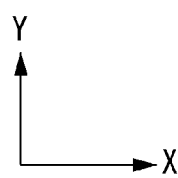
Figure 14:
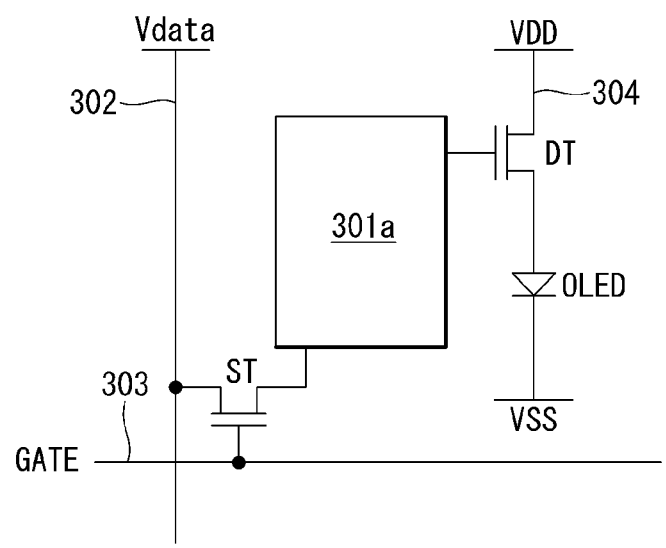
FIG. 14 is a circuit diagram showing an example of a pixel circuit, according to an embodiment of the present disclosure.
Figure 15:
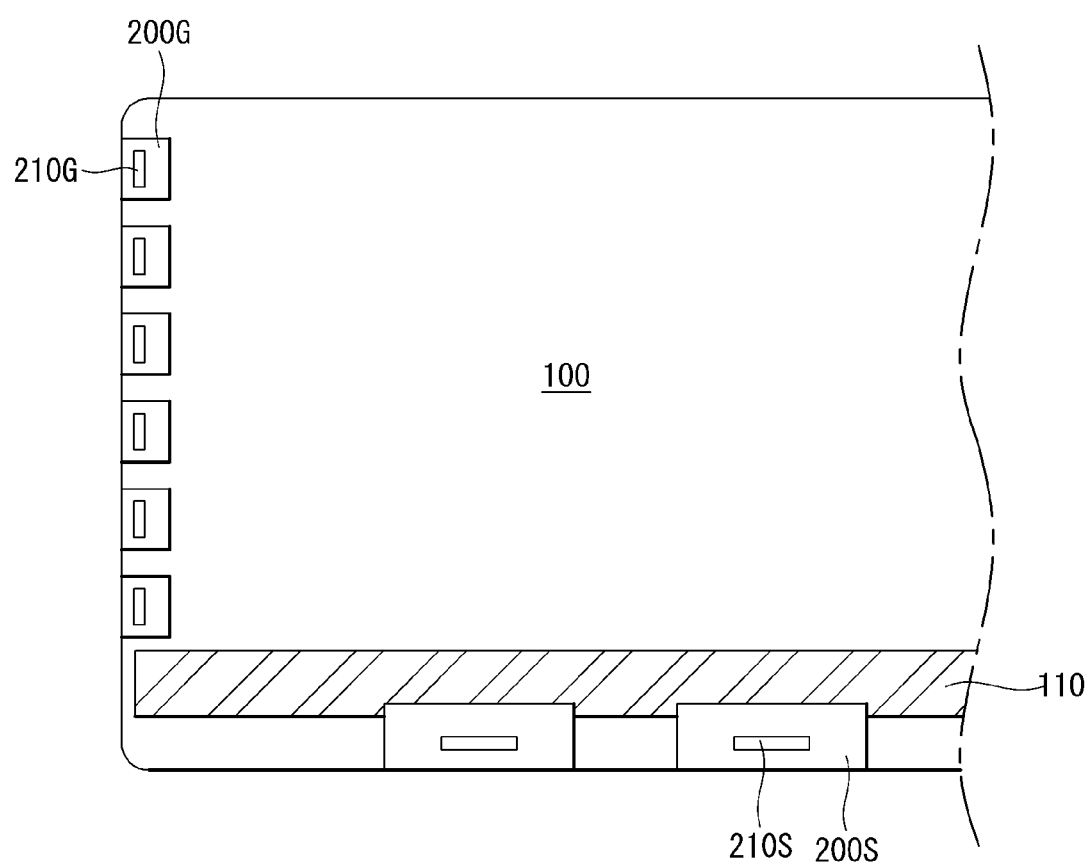
FIG. 15 is a diagram showing an example in which a display panel driving circuit is implemented as IC chips mounted on a film element, according to an embodiment of the present disclosure.

FIG. 13 is a block diagram showing a display device according to an embodiment of the present disclosure. FIG. 14 is a circuit diagram showing an example of a pixel circuit. FIG. 15 is a diagram showing an example in which a display panel driving circuit is implemented as IC chips 210S and 210G mounted on a film element 200.

Referring to FIGS. 13 to 15, a display device of the present disclosure includes a display panel 100 and a display panel driving circuit.

The display panel 100 includes a pixel array AA for displaying an input image on a screen. The pixel array AA includes a plurality of data lines 302, a plurality of gate lines 303 intersecting with the data lines 302, and pixels arranged in a matrix form. The pixel array AA may further include power supply lines (not shown), such as a VDD line 304, a Vref Nini line (e.g., a reference voltage/initialization voltage), a VSS line, and the like.

Each of the pixels may be divided into a red sub-pixel, a green sub-pixel, and a blue sub-pixel for color implementation. Each of the pixels may further include a white sub-pixel. Each of the sub-pixels 301 includes a pixel circuit. The pixel circuit may include an internal compensation circuit. As an example, the pixel circuit may be implemented as a circuit as in an example of FIG. 14, but is not limited thereto.

Touch sensors may be disposed on the display panel 100. Touch input may be sensed using separate touch sensors or may be sensed through the pixels. The touch sensors may be disposed on the screen of the display panel as an on-cell type or an add-on type, and implemented as in-cell type touch sensors embedded in the pixel array.

The display panel driving circuit includes a data driver 310 and a gate driver 320. The display panel driving circuit may further include a demultiplexer 312 disposed between the data driver 310 and the data lines 302. As shown in FIG. 15, the data driver 310 and the gate driver 320 may be implemented as IC chips 210S and 210G mounted on one or more film elements 200S and 200G.

The display panel driving circuit writes data of the input image to the pixels of the display panel 100 under control of a timing controller (TCON) 330. The display panel driving circuit may further include a touch sensor driver for driving the touch sensors. The touch sensor driver is omitted in FIG. 13. In a mobile device, the display panel driving circuit, the timing controller 330, and a power supply circuit may be integrated into one integrated circuit.

The data driver 310 converts digital data of the input image received from the timing controller 330 every frame period into a gamma compensation voltage to generate a data signal. The demultiplexer 312 including a plurality of switching elements is disposed between the data driver 310 and the data lines 302, and distributes data voltages output from the data driver 310 to the data lines 302 in a time division manner.

The gate driver 320 may be implemented as a Gate in Panel (GIP) circuit formed directly on the display panel 100 together with a TFT array of the pixel array AA, or implemented as the IC chip 210G mounted on the film element 200 as shown in FIG. 15. The gate driver 320 outputs a gate signal GATE to the gate lines 303 under control of the timing controller 330. The gate driver 320 shifts the gate signal GATE by using a shift register, so that it may sequentially supply the signal to the gate lines 303. The gate signal GATE may include a scan signal for selecting pixels of line on which data is to be written and an emission signal (or an EM signal) that defines the emission time of pixels charged with the data voltage, but is not limited thereto.

The timing controller 330 receives digital video data of the input image from a host system (not shown) and a timing signal synchronized with the digital video data. The timing signal includes a vertical synchronization signal Vsync, a horizontal synchronization signal Hsync, a clock signal DCLK, and a data enable signal DE. The host system may be any one of a television (TV) system, a set-top box, a navigation system, a personal computer (PC), a home theater system, and a mobile device.

The timing controller 330 multiplies an input frame frequency by i (i is a positive integer larger than 0) and may control operation timings of the display panel driving circuits at a frame frequency of the input frame frequency×i Hz. The input frame frequency is 60 Hz in the National Television Standards Committee (NTSC) system and 50 Hz in the Phase-Alternating Line (PAL) system.

The timing controller 330 generates a data timing control signal for controlling the operation timing of the data driver 310, a switch control signal for controlling the operation timing of the demultiplexer 312, and a gate timing control signal for controlling the operation timing of the gate driver 320 based on the timing signals Vsync, Hsync, and DE received from the host system. A voltage level of the gate timing control signal output from the timing controller 330 may be converted into a gate-on voltage and a gate-off voltage through a level shifter (not shown) and supplied to the gate driver 320. The level shifter converts a low level voltage of the gate timing control signal into a gate low voltage VGL and converts a high level voltage of the gate timing control signal into a gate high voltage VGH.

Each of the sub-pixels may include the pixel circuit as shown in FIG. 14. The pixel circuit may include a switching thin film transistor (TFT) ST, a switching circuit 301a, a driving TFT DT, and an organic light emitting diode (OLED).

The switching TFT ST supplies the data signal to the switching circuit 301a by conducting electricity to a current path between the data line 302 and the switching circuit 301a in response to the gate signal GATE from the gate line 303. The switching circuit 301a may include one or more switching TFTs and one or more capacitors to initialize a gate of the driving TFT DT, and include an internal compensation circuit that senses a threshold voltage of the driving TFT DT and compensates the data signal by adding the threshold voltage to a data signal voltage. Such a switching circuit 301a may be applied to any pixel compensation circuit of a known organic light emitting display device. The driving TFT DT is connected between the VDD line and the organic light emitting diode OLED, and adjusts a current flowing in the organic light emitting diode OLED depending on the data signal voltage applied to its gate. A pixel driving voltage VDD is supplied to the sub-pixels in common.

The organic light emitting diode OLED includes an organic compound layer in which a hole injection layer (HIL), a hole transport layer (HTL), an emission layer (EML), an electron transport layer (ETL), and an electron injection layer (EIL) are stacked.

As described above, the present disclosure groups the OLB pads of the film elements mounted on the film element into a plurality of areas, and differently applies the thermal correction amount for each area in consideration of the influence of the IC chip. As a result, the present disclosure may reduce the misalignment defect in the bonding process of the display panel and the film element.

Although embodiments have been described with reference to a number of illustrative embodiments thereof, it should be understood that numerous other modifications and embodiments may be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A film element for driving a display device comprising:
   a film substrate including wirings and pads connected to the wirings,
   wherein the pads comprise inner pads configured to be bonded to an integrated circuit (IC) chip, first pads arranged in a first area, and second pads arranged in a second area closer to the inner pads than the first pads,
   wherein a second thermal correction amount of the second area is smaller than a first thermal correction amount of the first area or has a negative value,
   wherein a length of the first area is set to a length obtained by subtracting the first thermal correction amount from a first reference length, and
   wherein a length of the second area is set to a length obtained by subtracting the second thermal correction amount from a second reference length.

2. The film element for driving the display device of claim 1, wherein the thermal correction amounts are inversely proportional to a pitch between the pads.

3. The film element for driving the display device of claim 1, wherein an average pitch between the second pads in the second area is larger than an average pitch between the first pads in the first area.

4. The film element for driving the display device of claim 1,
   wherein the first pads in the first area and the second pads in the second area are arranged in one row, and
   wherein the first pads in the first area are separated by the second area interposed therebetween.

5. The film element for driving the display device of claim 1, wherein:
   the pads further comprise third pads arranged in a third area,
   the third pads are closer to the inner pads than the second pads in the second area,
   a length of the third area is set to a length obtained by subtracting a third thermal correction amount from a third reference length,
   the third thermal correction amount is smaller than the second thermal correction amount or has a negative value,
   the first, second, and third pads respectively in the first area, the second area, and the third area are arranged in one row, and
   the first pads in the first area are separated by the second area and the third area interposed therebetween.

6. The film element for driving the display device of claim 1, wherein:
   the film substrate includes a first pad area including the first area and the second area and a second pad area including a fourth area and a fifth area,
   the pads further comprise fourth pads arranged in the fourth area and fifth pads arranged in the fifth area,
   the first pads in the first area and the second pads in the second area are arranged in one row in the first pad area, and
   the fourth pads in the fourth area and the fifth pads in the fifth area are arranged in one row in the second pad area.

7. The film element for driving the display device of claim 6, wherein:
   the fifth area is closer to the inner pads than the fourth area, and
   the fifth area has a smaller thermal correction amount than the fourth area or has a negative thermal correction amount.

8. A display device comprising:
   a display panel to which a film element bonded,
   wherein the film element comprises:
   a film substrate including wirings and pads connected to the wirings,
   wherein the pads comprise inner pads configured to be bonded to an integrated circuit (IC) chip, first pads arranged in a first area, and second pads arranged in a second area closer to the inner pads than the first pads,
   wherein a second thermal correction amount of the second area is smaller than a first thermal correction amount of the first area or has a negative value,
   wherein a length of the first area is set to a length obtained by subtracting the first thermal correction amount from a first reference length, and
   wherein a length of the second area is set to a length obtained by subtracting the second thermal correction amount from a second reference length.

* * * * *